US010109637B1

(12) United States Patent
Zang et al.

(10) Patent No.: US 10,109,637 B1
(45) Date of Patent: Oct. 23, 2018

(54) CROSS COUPLE STRUCTURE FOR VERTICAL TRANSISTORS

(71) Applicant: GLOBALFOUNDRIES INC., Grand Cayman (KY)

(72) Inventors: Hui Zang, Guilderland, NY (US); Randy W. Mann, Milton, NY (US); Bipul C. Paul, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/856,205

(22) Filed: Dec. 28, 2017

(51) Int. Cl.
| | |
|---|---|
| *H01L 27/11* | (2006.01) |
| *H01L 23/528* | (2006.01) |
| *H01L 23/522* | (2006.01) |
| *H01L 29/78* | (2006.01) |
| *H01L 29/417* | (2006.01) |
| *H01L 29/423* | (2006.01) |
| *H01L 29/45* | (2006.01) |

(52) U.S. Cl.
CPC ........ *H01L 27/1104* (2013.01); *H01L 23/528* (2013.01); *H01L 23/5226* (2013.01); *H01L 29/41741* (2013.01); *H01L 29/41775* (2013.01); *H01L 29/4236* (2013.01); *H01L 29/4238* (2013.01); *H01L 29/456* (2013.01); *H01L 29/7827* (2013.01)

(58) Field of Classification Search
CPC ...... H01L 21/84; H01L 27/11; H01L 27/1104; H01L 27/1203; H01L 23/5226; H01L 23/528; H01L 29/41741; H01L 29/41775; H01L 29/4236; H01L 29/4238; H01L 29/456; H01L 29/7827

USPC .......................................... 257/329, 206, 368
See application file for complete search history.

(56) References Cited

U.S. PATENT DOCUMENTS

| | | | | |
|---|---|---|---|---|
| 5,287,304 | A * | 2/1994 | Harward | G11C 11/412 365/189.011 |
| 7,465,973 | B2 * | 12/2008 | Chang | H01L 27/11 257/206 |
| 8,154,086 | B2 * | 4/2012 | Masuoka | H01L 21/84 257/380 |
| 8,754,481 | B2 | 6/2014 | Masuoka et al. | |
| 9,219,129 | B2 * | 12/2015 | Doris | H01L 29/66477 |
| 9,721,957 | B2 | 8/2017 | Nakanishi et al. | |
| 9,825,032 | B1 * | 11/2017 | Bentley | H01L 27/0886 |
| 9,859,898 | B1 * | 1/2018 | Anderson | H03K 19/17796 |
| 2004/0113207 | A1 * | 6/2004 | Hsu | G11C 11/412 257/368 |
| 2015/0318288 | A1 | 11/2015 | Lim et al. | |

* cited by examiner

*Primary Examiner* — Mohammed Shamsuzzaman
(74) *Attorney, Agent, or Firm* — Yuanmin Cai; Hoffman Warnick LLC

(57) ABSTRACT

The disclosure provides integrated circuit (IC) structure including: a substrate; a shallow trench isolation (STI) positioned between the first and second regions of the substrate; a first transistor with a channel region is positioned on the first region of the substrate, and spacer positioned on the first region of the substrate and the STI; and a gate metal positioned on the spacer. The gate metal includes a gate contact region positioned over the first source/drain region of the substrate, and surrounding the channel region. Across-couple region extends laterally from the gate contact region to the source/drain region of a second transistor formed on the second region of the substrate.

20 Claims, 8 Drawing Sheets

CROSS COUPLE STRUCTURE FOR VERTICAL TRANSISTORS

BACKGROUND

The present disclosure relates to integrated circuit (IC) structures, and more specifically, to IC structures which include a cross-couple structure between vertical transistors.

With increasing miniaturization of electronics, vertically oriented transistors, also known as vertical field effect transistors (VFETs), are increasingly incorporated into devices such as random access memory (RAM) bitcell arrays, logic devices, etc. Manufacturing processes to form active elements in IC fabrication, e.g., RAM bitcell formation, may include forming a cross-coupling structure between the gate node of one transistor and the source/drain region of another transistor. RAM in particular may take the form of "static RAM" (SRAM) or "dynamic RAM" (DRAM). Processes to form the conductive coupling between these nodes typically require multiple additional masks to form and pattern the regions where conductive material will be formed on the gates and source/drain regions of paired transistors. The continued miniaturization of electronics and evolution of device architecture (e.g., incorporation of VFETs) accompanies a technical demand to reduce the surface area occupied by each circuit feature, e.g., cross-coupling regions, as well as the manufacturability of such features.

Several transistors can be electrically connected to each other to provide fundamental elements of a digital circuit's architecture. An SRAM cell typically includes six transistors, four of which can be wired to form two cross-coupled voltage inverters, each including a pair of transistors, for storing binary digits (also known as "bits") in the form of "high" and "low" voltages, i.e., voltages above or below a predetermined threshold. The remaining two transistors in an SRAM structure can be known as "access transistors," so named because these transistors can control electrical access to the SRAM cell during read and write operations. Reducing the size of memory components in an IC, including SRAM cells, can allow more bits to be stored on one product and thereby reduce manufacturing costs per bit of storage. The development of different transistor structures, e.g., VFETs, may permit re-examination or re-design of RAM architectures and/or other device architectures.

SUMMARY

A first aspect of the disclosure provides integrated circuit (IC) structure including: a substrate having a first region and a second region, wherein a shallow trench isolation (STI) laterally separates the first region of the substrate from the second region of the substrate; a first vertically-oriented transistor including: a first source/drain region formed in the first region of the substrate; a channel region positioned on the first source/drain region; a second source/drain region positioned on the channel region, such that the channel region of the first vertically-oriented transistor is positioned vertically between the first and second source/drain regions; a spacer positioned on at least the first region of the substrate and the STI; a gate dielectric region laterally abutting a vertical sidewall of the channel region, and positioned on a portion of the spacer; and a gate metal laterally adjacent to the gate dielectric region including a gate contact region surrounding the gate dielectric region, and positioned over the spacer above the first region of the substrate; a second vertically-oriented transistor formed on the second region of the substrate; and a cross-couple region extending laterally from the gate contact region of the first vertically-oriented transistor to a source/drain region of the second vertically-oriented transistor underneath the cross-couple region.

A second aspect of the disclosure provides an integrated circuit (IC) structure including: a substrate having a first region and a second region, wherein a shallow trench isolation (STI) laterally separates the first region of the substrate from the second region of the substrate; a pair of first vertically-oriented transistors, wherein each first vertically-oriented transistor includes: a channel region positioned between a first and a second source/drain region; and a gate dielectric region laterally abutting a vertical sidewall of the channel region; a shared gate metal laterally adjacent to the gate dielectric region of each of the pair of first vertically-oriented transistors, the shared gate metal including a gate contact region surrounding each gate dielectric region, and positioned above the first region of the substrate; a second vertically-oriented transistor formed on the second region of the substrate; an access transistor formed on the second region of the substrate, wherein the access transistor and the second vertically-oriented transistor include a shared source/drain region within the second region of the substrate; and a cross-couple region extending laterally from the gate contact region of the shared gate metal and extending upwards from the shared source/drain region within the second region of the substrate.

A third aspect of the disclosure cross-couple structure for a static random access memory (SRAM) cell, the cross-couple structure including: a substrate having a first region and a second region, wherein a shallow trench isolation (STI) laterally separates the first region of the substrate from the second region of the substrate; a pair of first vertically-oriented transistors, wherein each of the pair of first vertically-oriented transistor includes: a first source/drain region formed in the first region of the substrate; a channel region positioned on the first source/drain region; a second source/drain region positioned on the channel region, such that the channel region of each first vertically-oriented transistor is positioned vertically between the first and second source/drain regions; a spacer positioned on at least the first region of the substrate and the STI; and a gate dielectric region laterally abutting a vertical sidewall of the channel region, and positioned on a portion of the spacer; a first shared gate metal laterally adjacent to the gate dielectric region of each of the pair of first vertically-oriented transistors, the first shared gate metal including a gate contact region surrounding each gate dielectric region, and positioned over the spacers above the first region of the substrate; a pair of second vertically-oriented transistors, wherein each of the pair of second vertically-oriented transistor includes: a first source/drain region formed in the second region of the substrate; a channel region positioned on the first source/drain region; a second source/drain region positioned on the channel region, such that the channel region of each second vertically-oriented transistor is positioned vertically between the first and second source/drain regions; a spacer positioned on at least the second region of the substrate and the STI; and a gate dielectric region laterally abutting a vertical sidewall of the channel region, and positioned on a portion of the spacer; a second shared gate metal laterally adjacent to the gate dielectric region of each of the pair of second vertically-oriented transistors, the second shared gate metal including a gate contact region surrounding each gate dielectric region, and positioned over the spacers above the second region of the substrate; a first cross-couple region extending laterally from the gate contact region of the first shared gate metal to the source/drain region of one of the pair of second vertically-oriented transistors; and a second cross-couple region extending laterally from the gate contact region of the second shared gate metal to the source/drain region of one of the pair of first vertically-oriented transistors.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a cross-couple structure for integrated circuits (ICs) which may be configured for use with vertical field effect transistors (VFETs). In an example application, cross-couple structures according to the present disclosure can be fabricated and/or combined with VFETs and other components to form, e.g., the structure of a static random access memory (SRAM) cell of an IC. According to the disclosure, a set of cross-coupled VFET transistors may be joined by a conductive cross-couple region positioned on a spacer extending laterally from the gate of one VFET transistor the source/drain region of another VFET transistor. The cross-couple region may be formed at least partially from a gate metal surrounding the channel of one VFET transistor. The spacer, gate metal, and VFET transistors may each be positioned underneath an overlying inter-level dielectric (ILD) layer and without being in direct contact with any conductive materials in the ILD layer.

Figure 1:
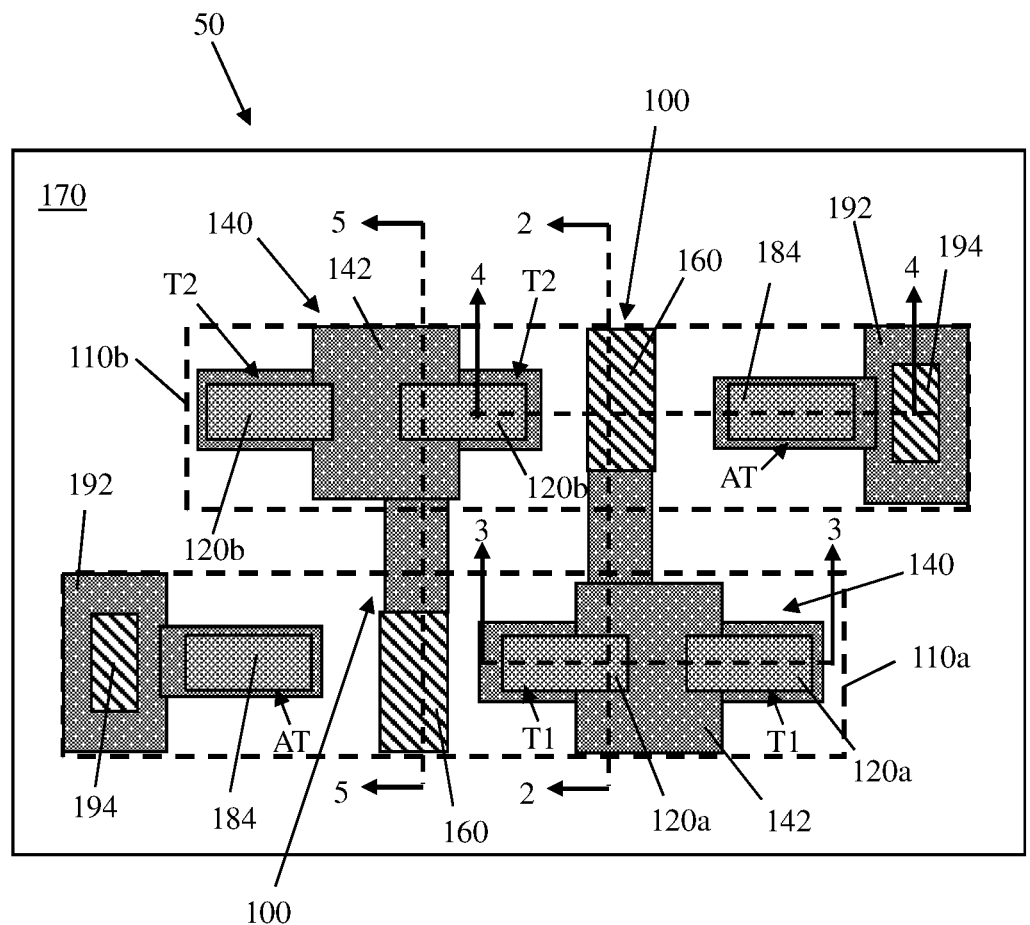
FIG. 1 shows a plan view of an SRAM cell with cross-couple structures according to embodiments of the disclosure.
Figure 2:
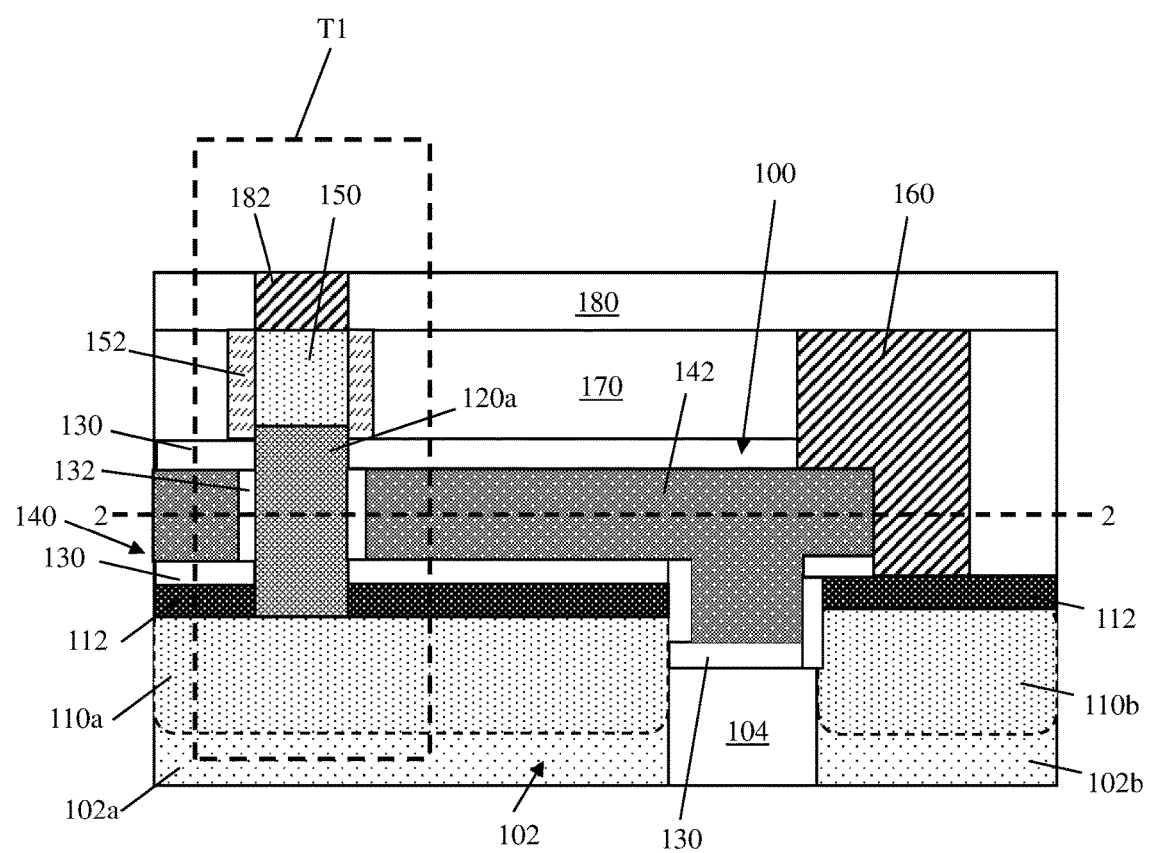
FIG. 2 shows a first longitudinal cross-sectional view along line 2-2 in FIG. 1 of a cross-couple structure according to embodiments of the disclosure.

Referring to FIGS. 1 and 2 together, an SRAM cell 50 (FIG. 1) including a pair of cross-couple structures 100 according to embodiments of the disclosure is shown. FIG. 1 provides a plan view of cross-couple structures 100 while FIG. 2 provides a longitudinal cross-sectional view of one cross-couple structure 100 along line 2-2 of FIG. 1. As shown, SRAM cell 50 may be composed of six vertically-oriented transistors, each having different operational functions. An SRAM cell may generally include two pairs of cross-coupled transistors each structured to provide an inverter structure, with two access transistors alternatively enabling and disabling the electrical connection between each inverter (i.e., each cross-coupled pair of transistors) and a word line for controlling memory storage within the pairs of transistors.

SRAM cell 50 may include a pair of first vertically-oriented transistors T1 adjacent to each other and connected to a single conductive region (e.g., gate metal 140 discussed herein) to yield one inverter structure for SRAM cell 50. SRAM cell 50 may also include a pair of second vertically-oriented transistors T2 adjacent to each other and connected to a single, different conductive region (e.g., another gate metal 140) to provide a separate inverter structure. As shown specifically in FIG. 1, each pair of vertically-oriented transistors T1, T2 may be associated with one of two access transistors AT for controlling the electrical connection between external conductive elements (e.g., a bit line) and the associated pairs of vertically-oriented transistors T1, T2 in an SRAM. Access transistors AT themselves may be coupled at their gates to another conductive element, e.g., a word line, for controlling the electrical connection between each pair of vertically-oriented transistors T1, T2 and a word line. Embodiments of the disclosure provide cross-couple structures 100 which take advantage of structural differences in vertically-oriented transistors, as compared to other transistor structures, to decrease the surface area of SRAM cell 50 and otherwise generally improve the operation of SRAM cell 50. To this extent, cross-couple structures 100 of SRAM cell 50 may include various components for connecting one pair of vertically-oriented transistors T1 to a corresponding second vertically-oriented transistor T2 and an access transistor AT which shares its source-drain region with the second vertically-oriented transistor T2. It is also understood that cross-couple structure(s) 100 may be adapted for use in structures other than SRAM cell(s) 50 without departing from the various structural details, operational principles, etc., described herein.

As shown specifically in FIG. 2, the various transistors T1, T2, AT (FIG. 1) of SRAM cell 50 may be built on a substrate 102 (FIG. 2) in the form of, e.g., an intermediate semiconductor wafer structure from which one or more transistors can be fabricated. Substrate 102 of SRAM cell 50 may be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained. Substrate 102 may be embodied as a portion of a silicon-on-insulator (SOI) structure, with a buried insulator (not shown) being positioned below substrate 102.

Two portions of substrate 102 in SRAM cell 50, respectively identified as first region 102a and second region 102b, may be horizontally separated from each other by a shallow trench isolation (STI) 104. STI 104 may be positioned laterally between regions 102a, 102b of substrate 102, such that a set of first vertically-oriented transistors T1 may be formed on first region 102a and a set of second vertically-oriented transistors T2 may be formed on second region 102b. The first and second regions 102a, 102b of substrate 102 may be distinguished from each other solely by the sets of vertically-oriented transistors T1, T2 formed thereon. Each region 102a, 102b may also include an access transistor (AT of FIG. 1) formed thereon, as described in more detail below.

STI(s) 104 can be formed between regions 102a, 102b by removing portions of substrate 102 to form trenches (not shown) and then filling the trenches with an electrically insulative material. Materials appropriate for the composition of STI 104 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials (e.g., various oxide and/or nitride compounds) having similar electrically insulating properties. STI 104 can generally be distinguished from other insulative materials by being positioned laterally adjacent to, or directly between, first and second regions 102a, 102b.

With continued reference to FIG. 2, embodiments of cross-couple structure 100 include the structure and components of a first vertically-oriented transistor T1 on substrate 102. To provide a source/drain region of first vertically-oriented transistor T1, portions of first region 102a of substrate 102 may be implanted with dopants (e.g., p-type or n-type dopants) to create a first source/drain region 110a of transistor T1. First source/drain region 110a is depicted in FIG. 1 with dotted lines denoting the position of first source/drain region 110a below overlying portions of first vertically-oriented transistor T1. First source/drain region 110a, upon being formed through ion implantation, may have a different composition from the remainder of substrate 102 in first region 102a. To form first source/drain region 110a, selected portions of substrate 102 (e.g., first region 102a) may be implanted with a strain-inducing material, such as silicon germanium or silicon carbon, formed on silicon, silicon germanium, and/or silicon carbon. First source/drain region 110a may be doped in situ to affect first vertically-oriented transistors T1 of cross-couple structure 100, e.g., before other components of first vertically-oriented transistor T1 are formed.

First vertically-oriented transistor T1 may include other materials for increasing the electrical conductivity between first source/drain region 110a and other components. For example, a silicide contact 112 may be formed directly on the uppermost surface of first source/drain region 110a to reduce parasitic capacitance in a related transistor structure. Silicide contacts 112 (FIG. 2) may be formed using any now known or later developed technique, e.g., performing an in-situ pre-clean, depositing a metal such as titanium, nickel, cobalt, etc., annealing to have the metal react with silicon to form a silicide material (e.g., titanium silicide, nickel silicide, cobalt silicide, etc.), and removing any exposed and unreacted metals after the annealing.

First vertically-oriented transistor T1 includes a vertically-oriented channel region connecting first source/drain region 110a to an overlying source/drain region 150 of first vertically-oriented transistor T1, as discussed in further detail below. A portion of semiconductor material overlying first source/drain region 110a may define a channel region 120a of first vertically-oriented transistor T1. Channel region 120a may be formed, e.g., by etching portions of a semiconductor material with a mask in place, such that the non-etched portions of semiconductor material beneath the mask form at least part of channel region 120a. Although a single channel region 120a is shown in FIG. 2, it is understood that each first vertically-oriented transistor T1 may include a respective channel region 120a positioned on the same first source/drain region 110a. Thus, first source/drain region 110a may be shared between two or more vertically-oriented transistors, e.g., the pair of vertically-oriented transistors T1 shown in FIG. 1. Channel region 120a of first vertically-oriented transistor T1 may be positioned vertically between first source/drain region 110a and an overlying source/drain region 150, formed from doped semiconductor material as discussed elsewhere herein.

First vertically-oriented transistor(s) T1 of cross-couple structure 100 may include one or more spacers 130, or spacers as maybe known to others, formed selectively on at least first source/drain region 110a and at least a portion of STI 104. Spacer(s) 130 may optionally be formed in contact with a second source/drain region 110b formed on second region 102b of substrate 102, as shown by example in FIG. 2. In further embodiments, spacer(s) 130 may be formed only on first source/drain region 110a and STI 104. Spacer(s) 130 may include one or more electrically insulating materials, e.g., one or more oxide or nitride insulators, configured to separate the source and/or drain of a transistor from nearby portions of a transistor gate. Spacer(s) 130 may be formed on at least first source/drain region 110a and STI 104 by conformal deposition. Chemical vapor deposition (CVD), in particular, may be a deposition process appropriate to form spacer(s) 130 on exposed portions of these components.

A thin gate dielectric layer or region 132 (FIG. 2) may be formed on the sidewall of channel region 120a, e.g., to provide a capacitive interface between channel region 120a and a gate metal 140 for adjusting the conductivity of channel region 120a. Gate dielectric region 132 may substantially laterally enclose a respective channel region 120a, e.g., as a result of conformal deposition. Gate dielectric region 132 may be composed of insulating material such as $SiO_2$ or a "high-k" dielectric material having a high dielectric constant, e.g., above 3.9. Further materials appropriate for use within gate dielectric region 132 may include silicon oxide ($SiO_2$), hafnium oxide ($HfO_2$), zirconium silicate ($ZrSiO_4$), and/or other types of dielectric materials described herein.

To facilitate or inhibit electrical conductivity through channel region 120a in first vertically-oriented transistor T1, a gate metal 140 may be formed on spacer(s) 130, and adjacent to gate dielectric region 132, to provide an electrically conductive region for controlling the flow of electrical current through channel region 120a. Gate metal 140 be conformally deposited on spacer(s) 130 and alongside the outer perimeter of gate dielectric region 132. Gate metal 140 may include, e.g., any combination of conducting materials (e.g., metal, doped semiconductor materials, etc.) for providing an electrostatic coupling to channel region 120a. As further examples, gate metal 140 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC) titanium (Ti), titanium nitride (TiN), titanium carbide (TiC), tungsten (W), tungsten nitride (WN), tungsten carbide (WC), polycrystalline silicon (poly-Si), and/or combinations thereof.

Gate metal 140 of first vertically-oriented transistor T1 may include, e.g., a gate contact region 142 for providing the electrical coupling to channel region(s) 120a. Gate contact region 142 of gate metal 140 may include all portions of gate metal 140 positioned directly above first source/drain region 110a, and electrically connected to a cross-couple region 160. Although gate contact region 142 of gate metal 140 is identified with a separate reference numeral for the sake of explanation, gate contact region 142 may form part of a single, structurally continuous gate metal 140.

As shown, gate metal 140 may form a conductive electrical connection between the gate region of first vertically-oriented transistor T1 (e.g., proximate channel region 120a) and the source/drain region of second vertically-oriented transistor T2 (e.g. a second source/drain region 110b formed on second region 102b of substrate 102). Although a first source/drain region 110a and a second source/drain region 110b are illustrated separately in the accompanying FIGS. to clarify their positions relative to other elements, it is understood that source/drain regions 110a, 110b may be formed together in a same process or separately with similar or different amounts and/or types of dopants implanted therein. As shown, the vertical thickness of channel region 120a in first vertically-oriented transistor T1 above substrate 102 may be greater than the vertical thickness of gate metal 140 above substrate 102. An additional spacer 130 may be positioned on top of gate dielectric region 132 and gate metal 140 to physically and electrically isolate gate metal 140 from overlying materials.

With continued reference to FIG. 2, first vertically-oriented transistor T1 may include overlying source/drain region 150 formed on channel region 120a to provide the other source/drain terminal of first vertically-oriented transistor T1. Overlying source/drain region 150 may provide the opposite-terminal (i.e., source or drain) function from the corresponding first source/drain region 110a beneath channel region 120a. Overlying source/drain region 150 may have the same material composition as first source/drain region 110a, i.e., a layer of semiconductor material with one or more dopants therein. Overlying source/drain region 150 may be formed by epitaxial growth, deposition and implantation, and/or any other technique or combination of techniques for creating a source/drain region of a vertical transistor. Cross-couple structure 100 may additionally include one or more source/drain spacers 152 positioned along the outer circumference of overlying source/drain region 150, e.g., to separate overlying source/drain region 150 from other portions of cross-couple structure 100. Source/drain spacers 152 may be formed from one or more spacer materials discussed elsewhere herein (e.g., oxide and/or nitride insulators appropriate for use as spacer(s) 130, 132), or other materials for electrical insulation of doped semiconductor materials.

Figure 3:
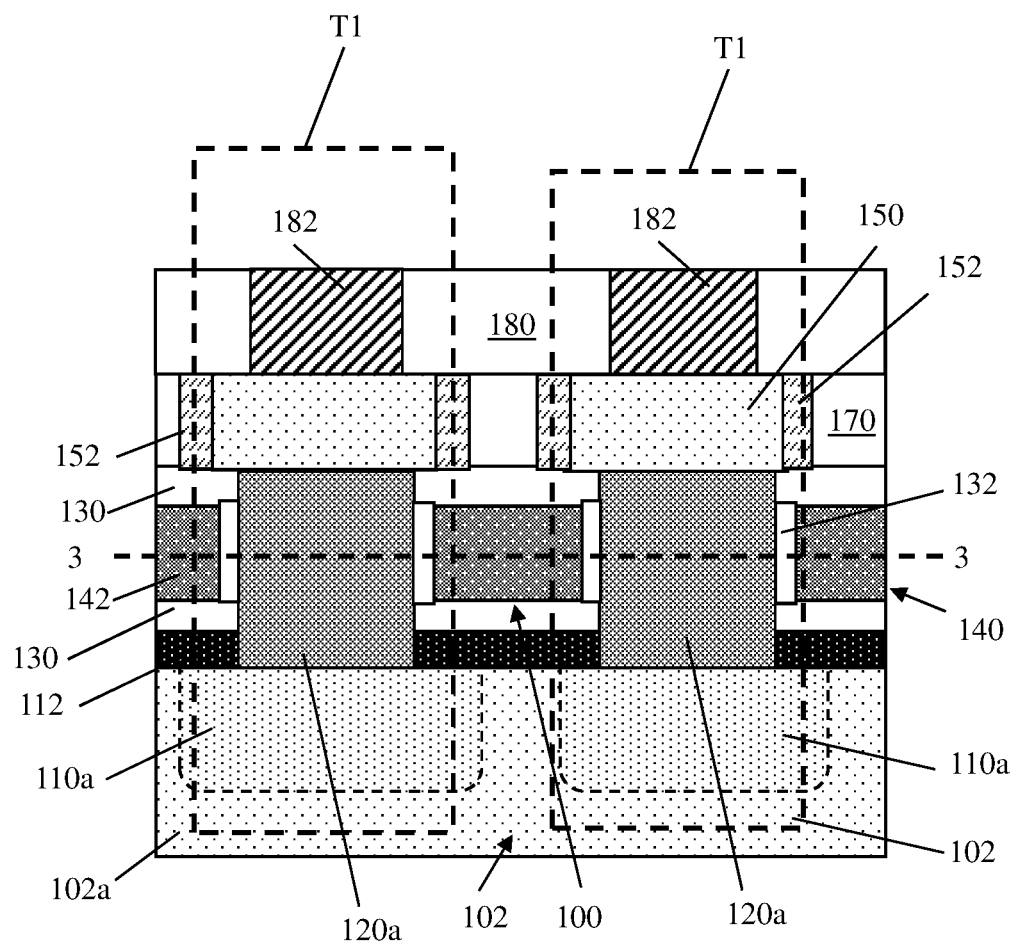
FIG. 3 shows a first latitudinal cross-sectional view along line 3-3 of FIG. 1 of the cross-couple structure according to embodiments of the disclosure.

Referring to FIGS. 1-3, cross-couple structure 100 may include cross-couple region 160 formed on second source/drain region 110b (e.g., directly on silicide contact 112 thereof) of a second vertically-oriented transistor T2. As shown specifically in FIG. 2, cross-couple region 160 may also be positioned on and/or directly alongside gate metal 140 at gate contact region 142. Cross-couple region 160 can be in the form of any currently known or later developed conductive metal, doped semiconductor layer, and/or other material for providing an electrical connection, and according to an example may include one or more of copper (Cu), aluminum (Al), etc. Additionally, before cross-couple region 160 is formed, a refractory metal liner (not shown) may also be formed along the sidewalls of adjacent dielectric material before forming the conductive material therein. The refractory metal liner may be formed, for example, by deposition and/or any other now known or later developed semiconductor fabrication techniques for forming a liner. The refractory metal liner may include any conventional liner material such as ruthenium and/or any other refractory metals such as tantalum (Ta), titanium (Ti), tungsten (W), iridium (Jr), rhodium (Rh) and platinum (Pt), etc., and/or mixtures thereof. Other conductive contacts, wires, vias, etc., discussed herein also may include refractory metal liners on sidewalls thereof.

Cross-couple region 160 to second source/drain region 110b of second vertically-oriented transistor T2 may be positioned within a dielectric region 170 for vertically separating and electrically insulating the components of each transistor T1, T2 from overlying components of a device. Spacer(s) 130 and gate metal 140 may similarly be embedded in dielectric region 170. Dielectric region 170 can initially be formed as a single, continuous layer, but can later be processed to include trenches, cavities, etc., as discussed herein. Materials appropriate for the composition of insulator 170 may include one or more materials appropriate for use for STI 104, or other electrically insulating materials. Dielectric region 170 in some cases may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

As illustrated specifically in FIG. 2, cross-couple region 160 may extend vertically upward from second source/drain region 110b and/or silicide contact 112 to approximately the upper surface of dielectric region 170. However, cross-couple region 160 may be structurally and electrically isolated from any conductive wires, vias, and/or other components embedded within an overlying inter-level dielectric (ILD) region 180 positioned over cross-couple region 160. As shown in FIG. 2, a portion of cross-couple region 160 may be positioned over and/or directly on STI 104, in cases where gate metal 140 does not extend laterally above second source/drain region 110b. The use of vertically-oriented transistors T1, T2 may allow cross-couple structure 100 to electrically connect the gate of first vertically-oriented transistor T1 (e.g., gate contact region 142 of gate metal 140) to the source/drain region of second vertically-oriented transistor T2 (e.g., second source/drain region 110b). These features of cross-couple structure 100 are a contrast to conventional structures, which may rely at least partially on conductive metals within inter-level dielectric (ILD) layer 180. Cross-couple region 160 may be formed in a single deposition, which share a same step(s) of forming other connecting vias and/or contacts in a device. Embodiments of cross-couple structure 100 may not require additional mask layers, in order to form cross-couple region 160, to prevent metal formation on other regions of substrate 102.

Inter-level dielectric material (ILD) 180 may be formed to initially cover the underlying portions of first vertically-oriented transistor T1 and other portions of cross-couple structure 100, e.g., source/drain regions 110a, 110b, channel region 120a, gate metal 140, overlying source/drain region 150, cross-couple region 160, dielectric region 170 etc., such that other underlying elements below these materials are also covered by ILD 180. ILD 180 may include one or more layers, films, etc., of dielectric material appropriate for structurally separating distinct layers of an IC structure, and to form a barrier to the underlying vertical transistor materials. ILD 180 may initially be formed on the exposed surfaces to a height above the top surface of dielectric region 170, thereby causing ILD 180 to initially cover overlying source/drain region 150 and each structural element covered by dielectric region 170. ILD 180 may be planarized subsequently with chemical mechanical polishing (CMP) or a similar process, such that the top surface of ILD 180 is substantially coplanar with any components (e.g., metal wires and vias) formed therein. A transistor contact 182 composed of a conductive material (e.g., one or more materials included within cross-couple region 160 or a different conductive material) may also be formed within ILD 180. Transistor contact 182 may electrically couple overlying source/drain region 150 to metal wires, vias, components, etc., (not shown) located within or above ILD 180. As noted elsewhere herein, cross-couple region 160 may be positioned entirely below ILD 180, such that cross-couple region 160 does not electrically connect to components other than gate metal 140 and/or second source/drain region 110b.

Referring to FIGS. 2 and 3 together, embodiments of the disclosure generally may provide for a pair of first vertically-oriented transistors T1 to be formed on first region 102a of substrate 102. FIG. 3, for example, shows cross-couple structure 100 along line 3-3 of FIG. 1, with two first vertically-oriented transistors T1 being formed to include a single source/drain region 110a. Gate contact region 142 of gate metal 140 thus may surround both channel regions 120a of the two first vertically-oriented transistors T1, each positioned over first source/drain region(s) 110a. As additionally shown, a set of overlying source/drain regions 150 (only one of which is visible in FIG. 2) may be included within the pair of first vertically-oriented transistors T1, each of which may also include portions of first source/drain region(s) 110a and the shared gate contact region 142 of gate metal 140. First pair of vertically-oriented transistors T1 thus may be cross-coupled at their gate terminals (e.g., channel region(s) 120a and gate contact region 142) to the source/drain region of the pair of second VFETs T2.

Returning briefly to FIG. 1, cross-couple structure 100 may be used to electrically connect various transistors T1, T2, AT of SRAM cell 500. As noted elsewhere herein, a pair of first vertically oriented-transistors T1 may together form an inverter cross-coupled to second vertically oriented transistor(s) T2 and access transistor AT through cross-couple structure 100. A pair of second vertically-oriented transistors T2 may be connected at their channel regions 120b back to first vertically-oriented transistor(s) T1 and another access transistor AT through a separate cross-couple structure 100. SRAM cell 50 thus may include access transistors AT (shown along respective access channel regions 184 thereof) to provide electrical access between the variously cross-coupled transistors and other device components.

Access transistors AT may be provided in the form of VFET transistors with vertically-oriented access channel regions 184, or alternatively may include other transistor architectures. In any case, access gates 192 may electrically connect a set of access channel regions 184 of access transistor(s) AT to other portions of a device, and thus may be electrically coupled to one or more wires, vias, etc., within ILD 180 (FIG. 2). In an SRAM cell, an access contact 194 coupled to access gates 192 may serve as or be coupled to a "word line" connection. A word line connection, including and/or electrically connected to access gates 192, can control whether access transistor(s) AT are turned on or off. Access contacts 194 can each be coupled to only one SRAM cell, or in alternative embodiments can be coupled to and shared between two or more adjacent SRAM cells. A bit line voltage (not shown) thus may be selectively electrically connected to or disconnected from SRAM cell 50 based on whether access transistors AT, have been turned on or off by the flow of current from access contacts 194 (e.g., in the form of word line connections). These functions of access transistors AT may be identical to conventional SRAM cell architectures, despite the presence of cross-couple structure(s) 100 discussed herein.

Figure 4:
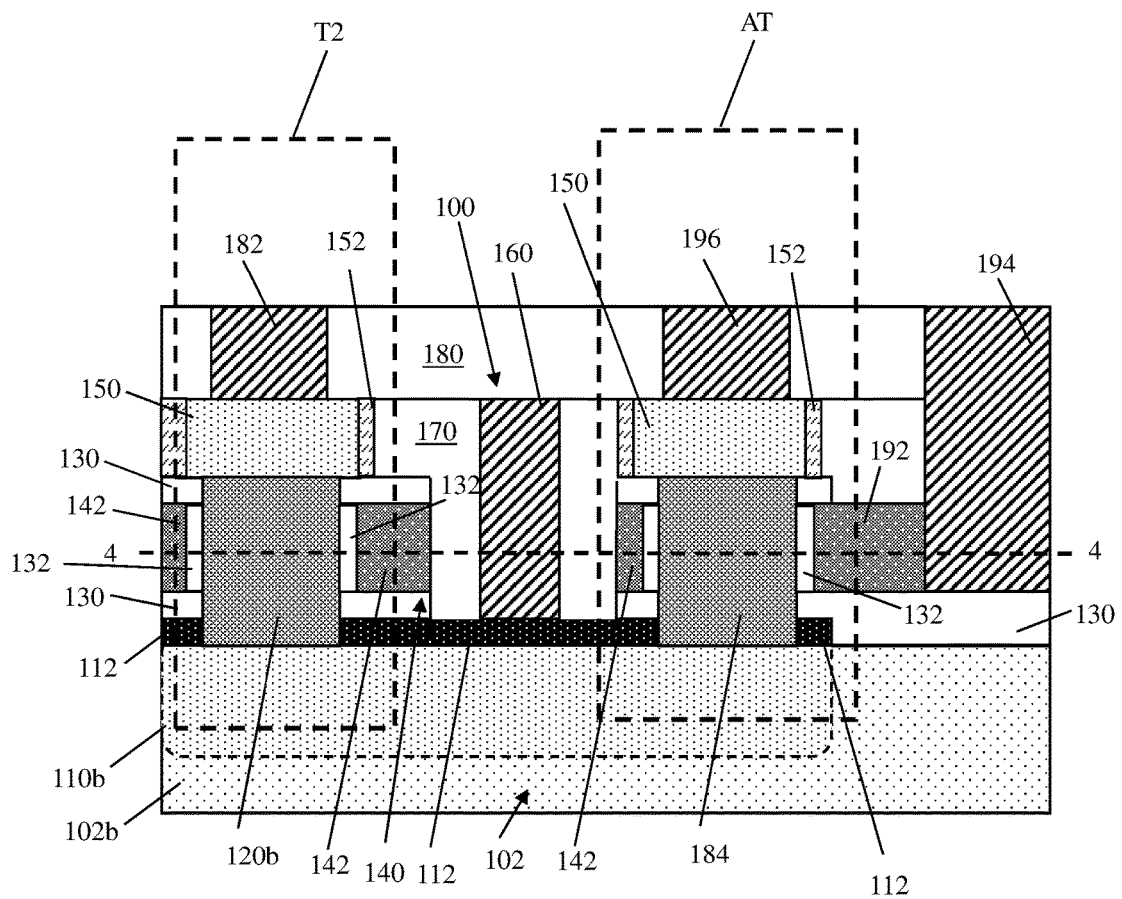
FIG. 4 shows a second latitudinal cross-sectional view along line 2-2 of FIG. 1 of the cross-couple structure according to embodiments of the disclosure.

Turning now to FIG. 4, a cross-sectional view along line 4-4 of FIG. 1 is provided to illustrate one second vertically-oriented transistor T2 and access transistor AT cross-each coupled at one source/drain terminal to first vertically-oriented transistors T1 (FIGS. 2, 3). Cross-couple region 160 may be positioned laterally between, and in some cases in substantial alignment with, second vertically-oriented transistor T2 and access transistor AT. The electrical connection between cross-couple region 160 and transistors T2, AT (e.g., through silicide contact 112) may form an electrical connection from gate metal 140 to one source/drain region 110b shared between second vertically-oriented transistor T2 and access transistor AT. As shown in FIG. 4, second vertically-oriented transistor T2 may have a similar architecture to that of first vertically-oriented transistors T1, e.g., by including channel region 120b positioned on second source/drain region(s) 110b, and in which overlying source/drain region 150 is positioned on channel region 120b. Second vertically-oriented transistor T2 may also be one of a pair of second vertically-oriented transistors T2, e.g., as shown in FIG. 1. Channel region 120b may also be associated with gate contact region 142 of another gate metal 140, thereby forming a cross-couple connection back to first VFETs T1 (FIGS. 2, 3), and as shown in the plan view of FIG. 1.

As shown in FIG. 4, cross-couple structure 100 may also include access transistor AT formed on second source/drain region 110b. Vertically-oriented access transistor AT may include, e.g., access channel region 184 formed on second source/drain region 110b of second region 102b of substrate 102. Thus, access transistor AT may share second source/drain region 110b with second vertically-oriented transistor T2. Access transistor At may also include gate dielectric region 132 formed alongside vertical sidewalls of access channel region 184, such that gate dielectric region 132 is laterally interposed between access channel region 184 and access gate 192. Access transistor AT may also include a overlying source/drain region 150 positioned on access channel region 184, in the same manner as vertically-oriented transistors T1, T2 discussed elsewhere herein. A bit line contact 196 may be formed on top of overlying source/drain region 150 of access transistor AT, to provide electrical access to the bit line voltage for SRAM cell 50 (FIG. 1) as discussed elsewhere herein. Thus, according to an embodiment of the disclosure, cross-couple structure 100 may take the form of a pair of first vertically-oriented transistors T1 electrically coupled to one second vertically-oriented transistor T2 and access transistor AT through gate metal 140 and cross-couple region 160.

Figure 5:
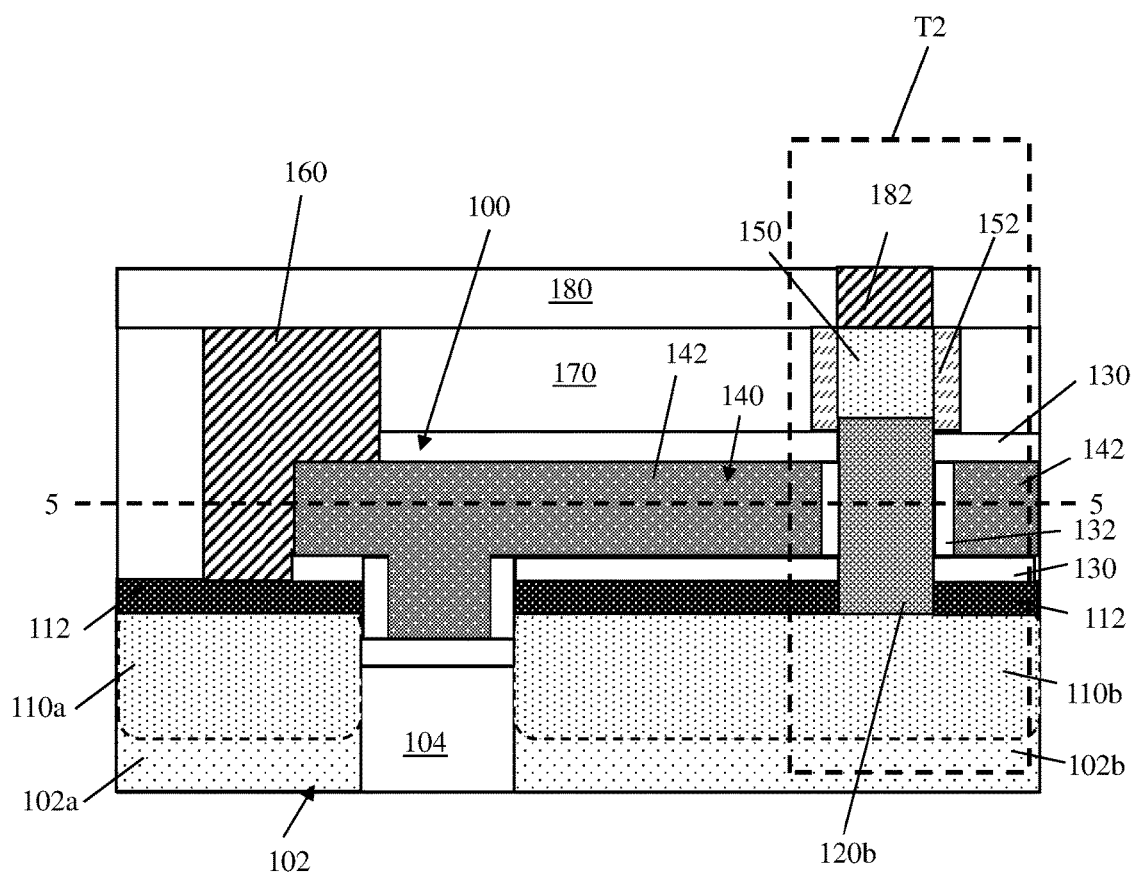
FIG. 5 shows a second longitudinal cross-sectional view along line 5-5 of FIG. 1 of the cross-couple structure according to embodiments of the disclosure.

Referring now to FIG. 5, a cross-section along line 5-5 in FIG. 1 is shown to better illustrate the reversible shape of cross-couple structure 100. Cross-couple structure 100 as shown in FIG. 5 provides a returning connection from gate metal 140 and channel region 110b of second vertically-oriented transistor T2 to first source/drain region 110a through another cross-couple region 160. Similar to the cross-section of FIG. 1 along line 202, cross-couple region 160 may be positioned below ILD 180, and in direct contact between gate metal 140 and first source/drain region 110a through silicide contact 112. Two cross-couple structures 100 thus may link the gate and source/drain terminals of two sets of vertically-oriented transistors (e.g., T1, T2) without additional components, structures, etc., being formed within ILD 180.

Figure 6:
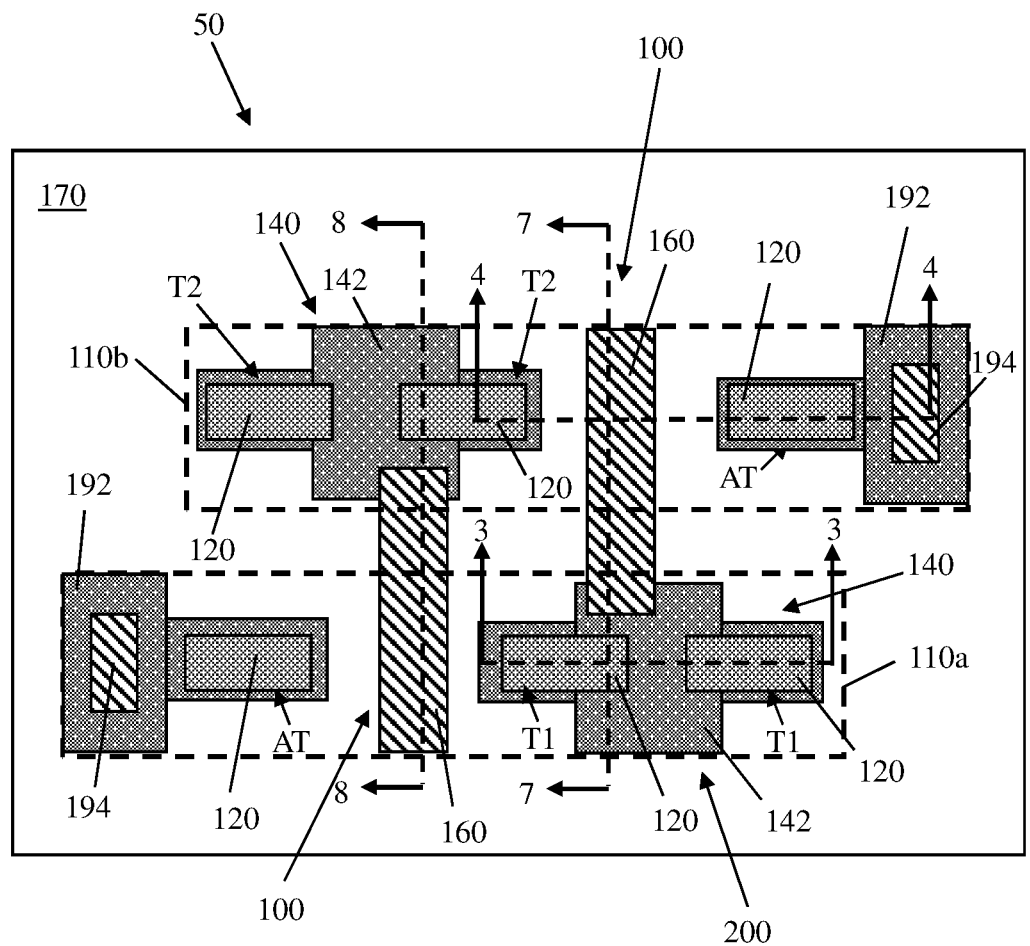
FIG. 6 shows a plan view of the SRAM cell with alternative cross-couple structures according to further embodiments of the disclosure.
Figure 7:
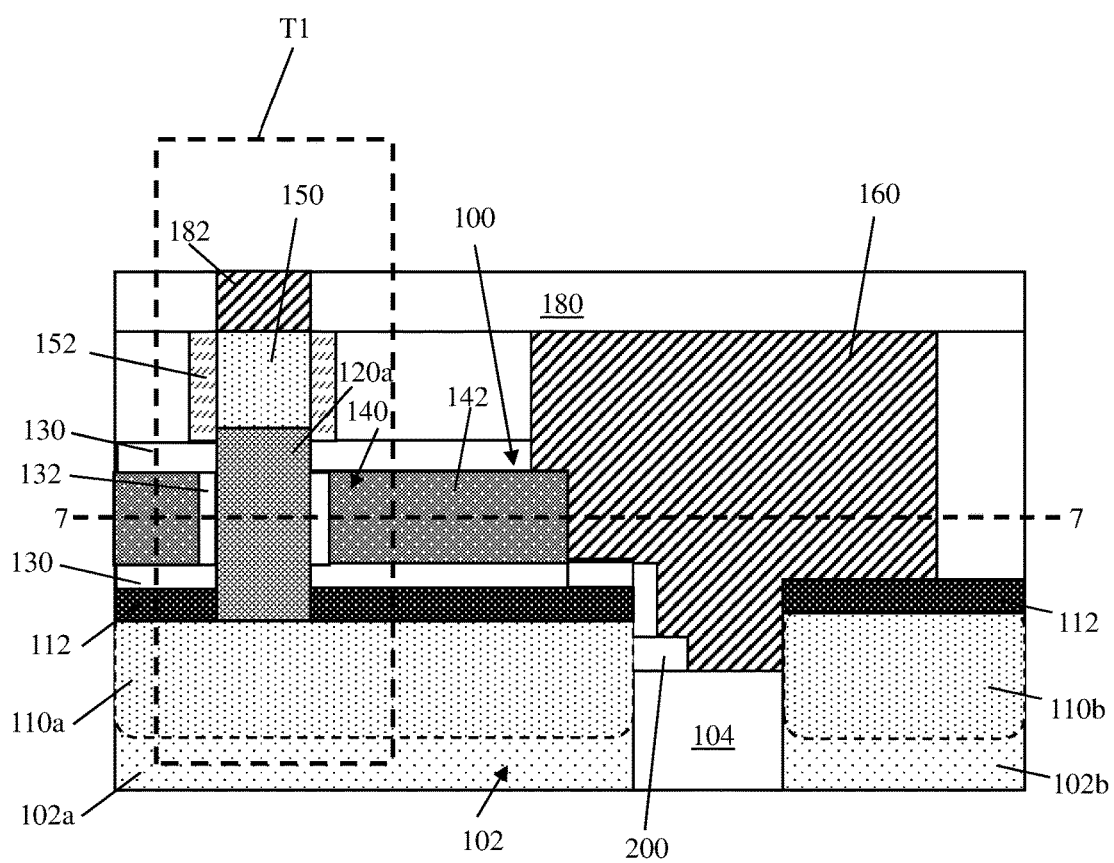
FIG. 7 shows a first longitudinal cross-sectional view along line 7-7 of FIG. 6 of one alternative cross-couple structure according to embodiments of the disclosure.
Figure 8:
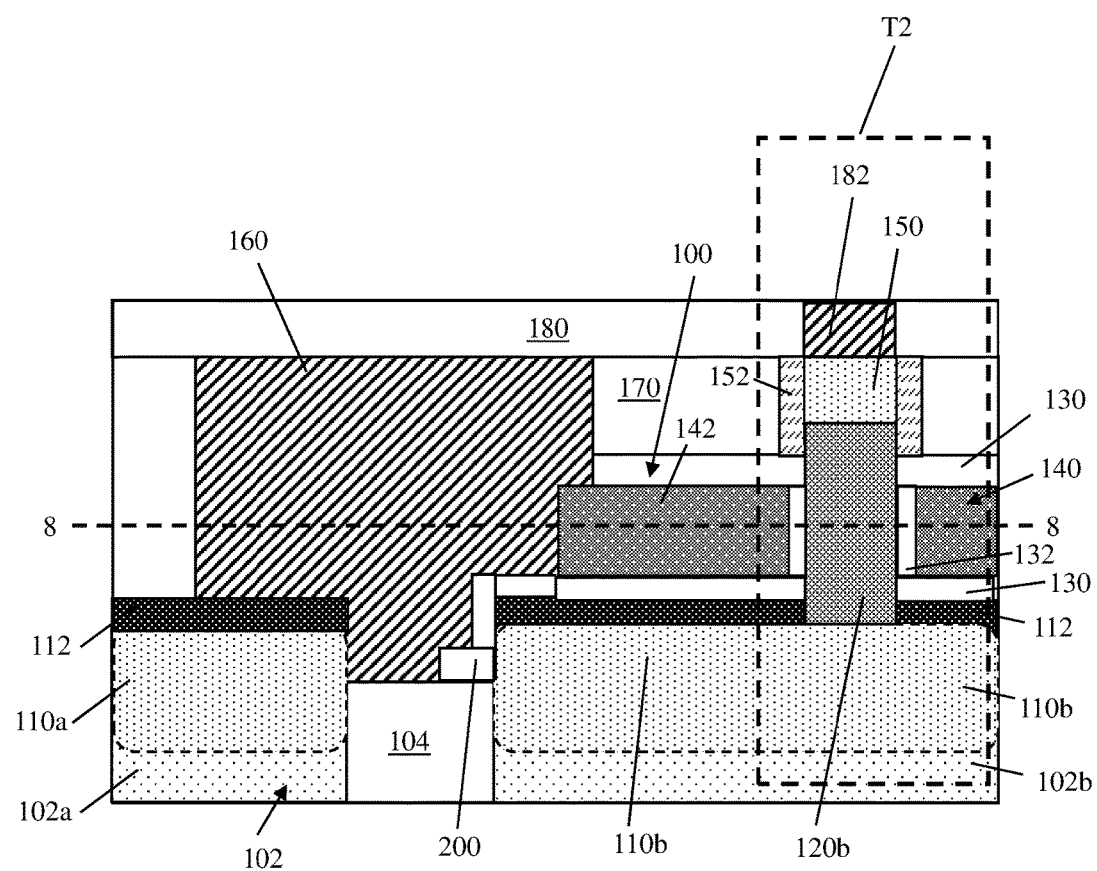
FIG. 8 shows a second longitudinal cross-sectional view along line 8-8 of FIG. 6 of the alternative cross-couple structure according to embodiments of the disclosure.

Before proceeding to discussion of subsequent structures, and accompanying FIGS., it is noted that that the various components described herein relative to one or more or FIGS. 1-5 may be present and depicted within in one of FIGS. 6-8 without significant modification, and that the various structures and/or embodiments described in this specification may be combined and/or substituted where appropriate without departing from the underlying technical concepts and characteristics of the present disclosure. It is again emphasized that the embodiments of cross-couple structure 100 discussed elsewhere and shown in the accompanying FIGS. 1-8 provide a single architecture of cross-couple structure 100 with possible variances in particular components, discussed herein. Thus, explanation of repeated components, elements, etc., of cross-couple structure 100 is omitted from the explanation of FIGS. 6-8. Additionally, the modifications to cross-couple structure 100 depicted in FIGS. 6-8 may alternatively be used in conjunction with embodiments of cross-couple structure 100 shown in FIGS. 1-5.

Referring to FIGS. 6-8 together, an embodiment of SRAM cell 50 and cross-couple structure 100 may be provided with one or modifications to the shape and position of gate metal 140 and/or cross-couple region(s) 160. It is noted that lines 3-3 and 4-4 are shown in FIG. 6 to emphasize that the cross-section of cross-couple structure 100 and IC 50 along lines 3-3 and 4-4 in FIG. 1 may be identical to the cross-sections depicted in FIGS. 3 and 4. As shown in each of FIGS. 6-8, gate contact region 142 of gate metal 140 in some cases may extend only partway across first source/drain region 110a, and without extending over any portion of STI 104 or second source/drain region 110b. In this case, cross-couple region 160 instead be formed over STI 104 and first source/drain region 110a to create the electrical coupling between gate contact region 142 of gate metal 140 and second source/drain region 110b of transistors T2, AT. Gate contact region 142 of gate metal 140 may have a significantly reduced size to compensate for the greater lateral surface area of cross-couple region 160. Despite the modifications to the relative size of gate metal 140 and cross-couple region 160 in this modified embodiment, the operational characteristics of cross-couple structure 100 may be unchanged as compared to other embodiments. In particular, both gate metal 140 and cross-couple region 160 may be positioned entirely beneath ILD 180 without being structurally or electrically coupled to any overlying components formed within ILD 180.

An additional structural difference between cross-couple structure 100 as shown in FIGS. 6-8 as compared to other forms of cross-couple structure 100 may include the presence of a mask layer 200 positioned on STI 104, alongside first source/drain region 110a, and on the upper surface of first source/drain region 110 of first vertically-oriented transistor T1, beneath cross-couple region 160. Mask layer 200 (FIGS. 7, 8 only) may be provided in the form of any currently known or later developed photo-sensitive material used in photolithography to transfer a pattern from a mask onto a wafer. Photoresist materials may include liquids deposited on the surface of the wafer as a thin film, which is then solidified by low temperature anneal. In the embodiment of cross-couple structure 100 shown in FIGS. 6-8, mask layer 200 (FIGS. 7, 8) may have a composition similar or equivalent to that of spacer(s) 130, e.g., one or more oxide or nitride insulators. In any case, mask layer 200 may be formed before cross-couple region 160 to prevent electrical shorting in cross-couple structure 100, e.g., between cross-couple region 160 and first source/drain region 110a of first vertically-oriented transistor T1. Cross-couple region 160 may be subsequently formed on mask layer 200 to structurally and electrically connect gate metal 140 and second source/drain region 110b as described above.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
   a substrate having a first region and a second region, wherein a shallow trench isolation (STI) laterally separates the first region of the substrate from the second region of the substrate;
   a first vertically-oriented transistor including:
   a first source/drain region formed in the first region of the substrate; a channel region positioned on the first source/drain region; a second source/drain region positioned on the channel region, such that the channel region of the first vertically-oriented transistor is positioned vertically between the first and second source/drain regions;
   a spacer positioned on at least the first region of the substrate and the STI; a gate dielectric region laterally abutting a vertical sidewall of the channel region, and positioned on a portion of the spacer; and
   a gate metal laterally adjacent to the gate dielectric region including a gate contact region surrounding the gate dielectric region, and positioned over the spacer above the first region of the substrate;
   a second vertically-oriented transistor formed on the second region of the substrate; and
   a cross-couple region extending laterally from the gate contact region of the first vertically-oriented transistor to a source/drain region of the second vertically-oriented transistor underneath the cross-couple region and a portion of the gate contact region extends to the source/drain region of the second vertically-oriented transistor.

2. The IC structure of claim 1, wherein at least a portion of the spacer is positioned on the source/drain region of the second vertically-oriented transistor.

3. The IC structure of claim 1, wherein the cross-couple region is positioned over the second region of the substrate, and the cross-couple region laterally abuts a sidewall of the gate metal above the second region of the substrate.

4. The IC structure of claim 1, wherein the source/drain region of the second vertically-oriented transistor further includes a silicide region, and wherein the cross-couple region is positioned on the silicide region.

5. The IC structure of claim 1, wherein the cross-couple region is positioned above the first region of the substrate, the STI, and the second region of the substrate, wherein the cross-couple region laterally abuts a sidewall of the gate metal of the first vertically-oriented transistor, the sidewall being above the first region of the substrate.

6. The IC structure of claim 1, further comprising an access transistor formed on the second region of the substrate, wherein the access transistor includes:
   a first source/drain region formed within the second region of the substrate, such that the source/drain region of the second vertically-oriented transistor is shared with a the first source/drain region of the access transistor;
   a channel region formed on the first source/drain region of the access transistor;
   a gate dielectric region surrounding the channel region of the access transistor;
   a gate metal laterally adjacent to the gate dielectric region, wherein the gate metal is electrically coupled to a word line contact; and
   a second source/drain region formed on the channel region of the access transistor, and electrically connecting the access transistor to a bit line contact.

7. The IC structure of claim 1, wherein the second vertically-oriented transistor includes a gate terminal cross-coupled to the first source/drain region of the first region of the substrate, such that the first vertically-oriented transistor and the second vertically-oriented transistor are each included within a cross-coupled pair of inverters.

8. An integrated circuit (IC) structure, comprising:
   a substrate having a first region and a second region, wherein a shallow trench isolation (STI) laterally separates the first region of the substrate from the second region of the substrate;
   a pair of first vertically-oriented transistors, wherein each first vertically-oriented transistor includes:
   a channel region positioned between a first and a second source/drain region; and
   a gate dielectric region laterally abutting a vertical sidewall of the channel region;
   a shared gate metal laterally adjacent to the gate dielectric region of each of the pair of first vertically-oriented transistors, the shared gate metal including a gate contact region surrounding each gate dielectric region, and positioned above the first region of the substrate;
   a second vertically-oriented transistor formed on the second region of the substrate;
   an access transistor formed on the second region of the substrate, wherein the access transistor and the second vertically-oriented transistor include a shared source/drain region within the second region of the substrate; and
   a cross-couple region extending laterally from the gate contact region of the shared gate metal and extending upwards from the shared source/drain region within the second region of the substrate and a portion of the gate contact region of the shared gate metal extends to the second region of the substrate.

9. The IC structure of claim 8, further comprising a spacer positioned on at least the first region of the substrate and the STI, wherein at least a portion of the spacer of each of the pair of first vertically-oriented transistors is positioned on the shared source/drain region of the at least one second vertically-oriented transistor.

10. The IC structure of claim 8, wherein the cross-couple region is positioned over the second region of the substrate, such that the cross-couple region laterally abuts a sidewall of the shared gate metal above the second region of the substrate.

11. The IC structure of claim 8, wherein the shared source/drain region of the second vertically-oriented transistor further includes a silicide region, and wherein the cross-couple region is positioned on the silicide region.

12. The IC structure of claim 8, further comprising an inter-level dielectric (ILD) region positioned directly on the cross-couple region, such that the shared gate metal and the cross-couple region are positioned beneath the ILD region.

13. The IC structure of claim 8, wherein the cross-couple region is positioned on the first region of the substrate, the STI, and the second region of the substrate, wherein the cross-couple region laterally abuts a sidewall of the shared gate metal above the first region of the substrate.

14. The IC structure of claim 8, wherein the access transistor includes:
the shared source/drain region formed within the second region of the substrate;
a channel region formed on the shared source/drain region;
a gate dielectric region surrounding the channel region of the access transistor;
a gate metal laterally adjacent to the gate dielectric region, wherein the gate metal is electrically coupled to a word line contact; and
an overlying source/drain region formed on the channel region, and electrically connecting the access transistor to a bit line contact.

15. A cross-couple structure for static random access memory (SRAM) cell, the cross-couple structure comprising:
a substrate having a first region and a second region, wherein a shallow trench isolation (STI) laterally separates the first region of the substrate from the second region of the substrate;
a pair of first vertically-oriented transistors, wherein each of the pair of first vertically-oriented transistor includes:
a first source/drain region formed in the first region of the substrate; a channel region positioned on the first source/drain region; a second source/drain region positioned on the channel region, such that the channel region of each first vertically-oriented transistor is positioned vertically between the first and second source/drain regions;
a spacer positioned on at least the first region of the substrate and the STI; and
a gate dielectric region laterally abutting a vertical sidewall of the channel region, and positioned on a portion of the spacer;
a first shared gate metal laterally adjacent to the gate dielectric region of each of the pair of first vertically-oriented transistors, the first shared gate metal including a gate contact region surrounding each gate dielectric region, and positioned over the spacers above the first region of the substrate;
a pair of second vertically-oriented transistors, wherein each of the pair of second vertically-oriented transistor includes:
a first source/drain region formed in the second region of the substrate; a channel region positioned on the first source/drain region; a second source/drain region positioned on the channel region, such that the channel region of each second vertically-oriented transistor is positioned vertically between the first and second source/drain regions;
a spacer positioned on at least the second region of the substrate and the STI; and
a gate dielectric region laterally abutting a vertical sidewall of the channel region, and positioned on a portion of the spacer;
a second shared gate metal laterally adjacent to the gate dielectric region of each of the pair of second vertically-oriented transistors, the second shared gate metal including a gate contact region surrounding each gate dielectric region, and positioned over the spacers above the second region of the substrate;
a first cross-couple region extending laterally from the gate contact region of the first shared gate metal to the source/drain region of one of the pair of second vertically-oriented transistors and a portion of the gate contact region of the first shared gate metal extends to the source/drain region of one of the pair of second vertically-oriented transistors; and
a second cross-couple region extending laterally from the gate contact region of the second shared gate metal to the source/drain region of one of the pair of first vertically-oriented transistors and a portion of the gate contact region of the second shared gate metal extends to the source/drain region of one of the pair of first vertically-oriented transistors.

16. The cross-couple structure of claim 15, further comprising a first access transistor formed on the first region of the substrate, wherein the first access transistor includes:
a first source/drain region formed within the first region of the substrate, such that the source/drain region of one of the pair of first vertically-oriented transistor is shared with a the first source/drain region of the access transistor;
a channel region formed on the first source/drain region of the first access transistor;
a gate dielectric region surrounding the channel region of the first access transistor;
a gate metal laterally adjacent to the gate dielectric region, wherein the gate metal is electrically coupled to a first word line contact; and
an overlying source/drain region formed on the channel region of the first access transistor, and electrically connecting the access transistor to a first bit line contact.

17. The cross-couple structure of claim 16, further comprising a second access transistor formed on the second region of the substrate, wherein the second access transistor includes:
a first source/drain region formed within the second region of the substrate, such that the source/drain region of one of the pair of second vertically-oriented transistor is shared with a the first source/drain region of the second access transistor;
a channel region formed on the first source/drain region of the second access transistor;
a gate dielectric region surrounding the channel region of the second access transistor;
a gate metal laterally adjacent to the gate dielectric region, wherein the gate metal is electrically coupled to a second word line contact; and
an overlying source/drain region formed on the channel region of the first access transistor, and electrically connecting the access transistor to a second bit line contact.

18. The cross-couple structure of claim 15, further comprising an inter-level dielectric (ILD) region positioned directly on the first and second cross-couple regions, such that the first and second shared gate metals, and the first and second cross-couple regions, are positioned beneath the ILD region.

19. The cross-couple structure of claim 15, wherein the first cross-couple region is positioned over the second region of the substrate, such that the first cross-couple region laterally abuts a sidewall of the first shared gate metal above the second region of the substrate.

20. The cross-couple structure of claim 15, wherein the first cross-couple region is positioned on the first region of the substrate, the STI, and the second region of the substrate, wherein the first cross-couple region laterally abuts a sidewall of the first shared gate metal above the first region of the substrate.

\* \* \* \* \*